TRANSISTOR MONOSTABLE CIRCUIT

Filed March 18, 1955

INVENTORS P. A. BAKER
E. E. SUMNER
BY William F. Simpson.
ATTORNEY

United States Patent Office 2,931,920
Patented Apr. 5, 1960

2,931,920

TRANSISTOR MONOSTABLE CIRCUIT

Paul A. Baker, New York, N.Y., and Eric E. Sumner, North Caldwell, N.J., assignors to Bell Telephone Laboratories, Incorporated, New York, N.Y., a corporation of New York Application March 18, 1955, Serial No. 495,312

13 Claims. (Cl. 307—88.5)

Figure 1:
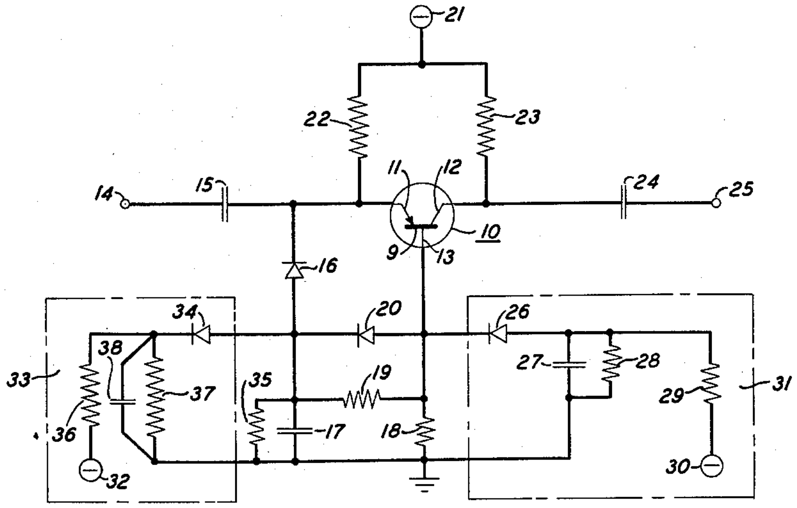

This invention relates to transistor trigger circuits and more particularly to transistor monostable circuits utilized as pulse amplifiers, pulse timing circuits or pulse shaping circuits.

A trigger circuit is a circuit arrangement which generally has at least one equilibrium position and which can be readily shifted, displaced or "triggered" from that condition. Devices such as transistors which have a current amplification factor greater than one lend themselves to trigger circuit applications. By connecting a relatively large feedback impedance to the base electrode of the transistor, the input characteristic of the transistor has a negative resistance region. By triggering the circuit is meant the causing of the transistor therein to rapidly pass from an equilibrium condition through the negative resistance region. Such trigger circuits having a transistor and a base impedance are disclosed, for example, in the Patent 2,629,833 which issued to R. L. Trent on February 24, 1953, and the Patent 2,670,445 which issued to J. H. Felker on February 23, 1954.

Trigger circuits may be monostable having one equilibrium condition, astable having no equilibrium condition, or bistable having two equilibrium conditions. The type of trigger circuit generally depends upon whether the emitter load line intersects the input characteristic in one of its positive resistance regions, in its negative resistance region, or in all of the three regions. Monostable trigger circuits generally contain emitter capacitors or other energy storing devices which partially determine the duration of the output pulses. The duration of the output pulse provided by a transistor monostable trigger circuit is also dependent upon the current amplification factor of the transistor, the pulse repetition frequency of the input and the voltages supplied by the circuit potential sources. The utilization of a transistor having a larger current amplification current factor, for example, increases the duration of the output pulse. Moreover, an increase of the pulse repetition frequency may decrease the duration of the output pulse.

It is an object of the present invention to provide a monostable pulse amplifier which has an output pulse duration that is independent of transistor variations, battery variations and variations in pulse repetition frequency.

In accordance with an embodiment of the present invention, two pulse duration control circuits are utilized, one connected to the base electrode of the transistor and one connected across an emitter capacitor. The first control circuit includes a serially connected diode and battery which clamp the base potential. The base potential is clamped to prevent negative excursions below the clamping potential in order to fix the termination point of the output pulse. Variations of the current amplification factor tend to vary the termination point of the output pulse by shifting or lowering the valley point of the transistor negative resistance characteristic. By clamping the base potential in this manner, the first control circuit avoids this variable portion of the characteristic. A feature of the present invention therefore resides in the provision of a control circuit which clamps the base potential to fix the terminating point of the output pulse.

The second control circuit clamps the emitter equilibrium potential to prevent positive excursions above the equilibrium potential in order to establish the same beginning point for each output pulse. Ordinarily, as the pulse repetition rate is increased, the potential at the emitter would not be restored to that of the equilibrium condition. The second control circuit includes a serially connected diode and battery which stabilize the initial emitter voltage independently of changes in the pulse repetition frequency.

Another feature of the present invention therefore resides in the provision of a control circuit which clamps the emitter potential to fix the beginning point of the output pulse.

A further feature of the present invention resides in the provision of voltage divider means for making the output pulse duration independent of variations in the voltage of the circuit battery. Each control circuit includes a voltage divider means.

Figure 2:
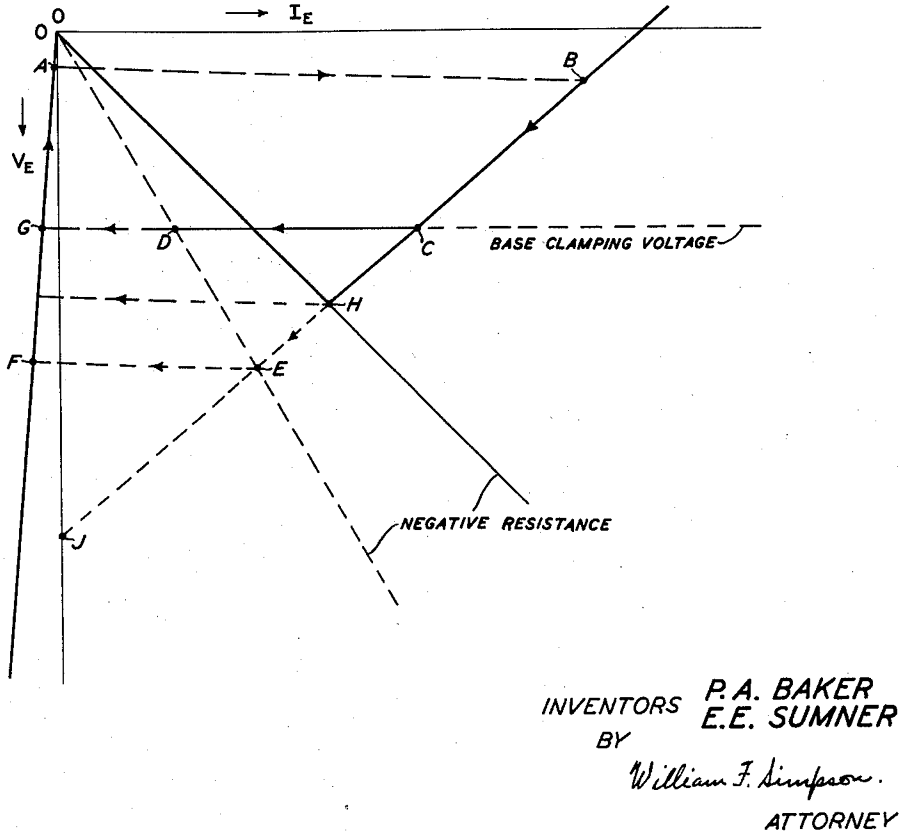

These and further objects and features of this invention may be more fully understood from the consideration of the following description when read in conjunction with the attached drawings wherein:

Fig. 1 is a circuit representation of a monostable pulse amplifier embodying features of the present invention; and Fig. 2 illustrates two idealized transistor characteristics.

The trigger circuit illustrated in Fig. 1 employs a transistor 10 having a semiconductor body 9 and an emitter, or input, electrode 11, a collector electrode 12 and a base, or control, electrode 13 connected thereto. The transistor 10 is of the point contact type described for example in Patent 2,524,035 granted October 3, 1950, to J. Bardeen and W. H. Brattain, which has a current amplification factor greater than one. The present invention is not restricted to the use of a single transistor having a current amplification factor greater than one, as, for example, two transistors each having current amplification factors less than one may be interconnected to function as a single transistor. Such transistor interconnections are disclosed for example in the Patent 2,655,609 granted to W. Shockley on October 13, 1953. Electrode currents are deemed positive if they flow from the electrode into the semiconductive body. A small positive current applied to the emitter electrode results in a negative current in the collector electrode which generally will exceed the emitter electrode current in magnitude. This current multiplication exists in most transistors of this type. If the semiconductive body is of p-type material, the normal directions of electrode current flow and the poling of the biasing batteries are reversed. The transistors employed in the present description will be assumed to be n-type, although the invention itself contemplates p-type transistors as well as other known types.

The emitter electrode 11 of transistor 10 is connected by the coupling capacitor 15 to the input terminal 14, and the collector electrode 12 is connected by the coupling capacitor 24 to the output terminal 25. The base electrode 13 is connected to ground through the resistor 18 and to the emitter electrode 11 through the serially connected varistors 20 and 16. The varistor 20 is shunted by the resistor 19, and the junction of varistors 16 and 20 is connected to a grounded emitter capacitor 17.

A biasing path maintains the emitter electrode 11 at a potential that is more negative than the potential at the base electrode 13. The biasing path essentially is from ground through resistor 18, the parallel combination of resistor 19 and varistor 20, the varistor 16 and a resistor 22 to a negative battery 21. Resistor 35 and the circuit 33, as is hereinafter described, effect the biasing by clamping the emitter potential.

An idealized form of the transistor input volt-ampere characteristic is shown in Fig. 2. The volt-ampere emitter characteristic of the circuit, which is roughly an N-shaped curve, is from point F, through the origin, to point H and then to point B.

With no input, the monostable pulse amplifier shown in Fig. 1 is in a low current quiescent condition. In accordance with the illustrative embodiment of the invention, the emitter load line, not shown, intersects the emitter current-voltage characteristic of the circuit only in the low-emitter current positive resistance region. With such a load line, the trigger circuit is monostable. The quiescent condition of the transistor 10 is at point A which is at a small negative emitter potential and current. The emitter-to-base potential, because of forward-biased diodes 20 and 16, is very small so that the resistor 19 is effectively short-circuited. The resistor 19 is utilized for stability purposes to prevent false operation when the leakage base-to-collector current increases. The leakage current increases when the atmospheric temperature is high. With an increased quiescent base-to-collector current, the voltage drop across resistor 18 due to the current through the base 13 may exceed the voltage drop across resistor 35 to reverse-bias the varistor 20 and thus tend to isolate the emitter electrode 11 from the base electrode 13. If the potential of the emitter electrode 11 is allowed to be more positive than the potential of the base electrode 13, the transistor 10 triggers or falsely operates. The resistor 19 maintains a biasing path even though it slightly decreases the biasing current. The trigger circuit is designed for maximum base-to-collector leakage, or quiescent current, of 1 milliampere which is approximately three times the normal base-to-collector quiescent current. The resistor 19, therefore, tends to cause the emitter potential to follow the base potential with changes in the quiescent base-to-collector current.

The resistors 18 and 23 function together with transistor 10 to provide for the negative resistance characteristic. The base current is the algebraic sum of the emitter and collector currents, and since the collector current is normally negative and larger in magnitude than the emitter current, the base current for positive emitter currents will be positive. Therefore, when the transistor 10 is in its active condition during triggering, a positive emitter current will result in a positive base current, which, by flowing through the large base resistance 18, makes the base negative with respect to the emitter. Accordingly the emitter current will be increased, inducing an even larger positive base current. It is this regenerative feedback which gives rise to the negative resistance characteristic which is shown in Fig. 2.

The junction of varistors 20 and 16 is connected to a control circuit 33 which comprises a serially connected varistor 34, resistor 36 and battery 32, and a resistor 37 which connects varistor 34 to ground. The control circuit 33, as is hereinafter described, clamps the emitter potential and controls the initial magnitude of the output pulse. The potential at the junction of resistors 36 and 37 is essentially that indicated by the equilibrium point A in Fig. 2. If the potential of the junction between varistors 16 and 20 tends to become more positive than the potential at the junction of resistors 36 and 37, the varistor 34 becomes forward-biased and allows current therethrough to maintain the varistor junction potential. The control circuit 33 functions to control the initial magnitude of the output pulse which, as is hereinafter described, tends to vary with the pulse repetition frequency. The initial magnitude for a given transistor and potential source is determined by the emitter circuit time constant.

The base electrode 13 is connected to a pulse duration control circuit 31. The duration control circuit 31 includes a varistor 26 which is connected to ground through the parallel circuit comprising resistor 28 and capacitor 27 and to negative battery 30 through resistor 29. During the quiescent stage, the diode 26 is reverse-biased because the potential at the junction between resistors 28 and 29 is, as shown in Fig. 2 at points G and C, lower than that of the base electrode 13 which is at a potential substantially equivalent to that at point A. The control circuit 31, as is hereinafter described, clamps the base voltage in order to control the duration of the output pulse independent of transistor changes.

When a positive pulse is supplied to the input terminal, a potential develops between the emitter electrode 11 and ground. The capacitor 17 tends to maintain the potential at the junction of varistors 16 and 20 as that varistor 16 becomes reversed-biased whereas varistor 20 remains in its low impedance condition. In this manner the potential at the base electrode 13 is temporarily maintained by the capacitor 17 while a positive potential is being applied at the emitter electrode 11. When the input trigger voltage exceeds the emitter-to-base voltage determined by the bias network, described above, and the input threshold voltage of the transistor 10, the transistor 10 becomes conducting and triggers into the negative resistance region of the input characteristic. The negative resistance region is shown in Fig. 2 as the line from the origin to point H.

At the beginning of the triggering or switching interval, the base impedance to ground is substantially the parallel combination of resistor 18 with the series circuit of varistor 20 and capacitor 17. The impedance of varistor 20 when it is forward-biased is of course much lower than that of resistor 18 so that at the beginning of the triggering interval almost all of the base current flows through the variator 20. In this manner, as the transistor 10 is initially triggered into its negative resistance region, the capacitor 17 supplements the current which comes through resistor 18. When the base potential falls below that of the junction between varistors 16 and 20, as maintained by capacitor 17, the varistor 20 becomes reversed-biased and assumes its high impedance condition. The potential across the capacitor 17 has not changed appreciably since the varistor 20 becomes reversed-biased almost immediately or substantially at the beginning of the triggering interval through the negative resistance region. The varistor 20 becomes reversed-biased approximately when the base potential falls below the potential equivalent to point A in Fig. 2.

When the emitter potential becomes lower than that of the junction between the two varistors 16 and 20, the varistor 16 becomes forward-biased. Since the base and emitter potentials are substantially similar due to the relatively small internal emitter-to-base impedance when the transistor 10 is conducting, the varistor 16 becomes forward-biased at approximately the same time that the varistor 20 becomes reversed-biased. When varistor 16 is forward-biased, the capacitor 17 discharges therethrough supplying the emitter current. In this manner, the transistor 10 is triggered to its current saturated state corresponding to point B in Fig. 2. The dashed line from point A to point B illustrates functionally the triggering operation to the saturated state. The magnitude of the initial saturation current is determined primarily by the parallel combination of resistors 18 and 23, the battery voltage, and the initial emitter capacitor voltage. The load impedance, not shown, is assumed to be large in comparison with resistor 23 so that its effect is negligible.

The capacitor 17 is shunted by a resistor 35, the effect of which is to increase the time that the transistor 10 remains in its saturated, or high current, state. The resistor 35 provides an additional path for current from ground to augment the emitter current supplied by capacitor 17. Such a resistor may be desirable since the size of the capacitor 17 is limited by the maximum repetition frequency. If capacitor 17 is too large, the recharge time constant becomes comparable to the repetition period and the capacitor does not completely recharge or even recharge to the potential determined by the voltage divider composed of resistors 36 and 37 before the succeeding input pulse. The resistor 35 must be greater than the maximum possible negative slope of the emitter characteristic in order to avoid bistable operation. In the preferred embodiment of the present invention, for example, resistor 35 has a resistance more than twice as large as the resistor 18.

Since there is no stable operating point in the high current positive resistance region or saturated state of the characteristic, the circuit returns from point B along the volt-ampere characteristic towards its equilibrium condition indicated by point A. As capacitor 17 discharges through the emitter electrode 13, the emitter potential, and with it the base and collector potentials, becomes more negative. The operating point in this manner moves from point B on the input characteristic towards points C. The potential at point C is determined by the voltage divider action of resistors 28 and 29. When the base potential becomes more negative than the potential at the junction of resistors 28 and 29, the varistor 26 becomes forward-biased and the path from the base electrode 13 through varistor 26 and capacitor 27 substantially short-circuits the resistor 18. The base electrode 13 is in this manner clamped at the potential equivalent to point C and is prevented from becoming more negative in potential than the potential of point C. The emitter capacitor 17 is also clamped to this potential through the diode 16 and the electrodes 11 and 13. Since the emitter current is proportional to the time rate of change of the capacitor voltage, the emitter current deteriorates rapidly with the potential thereat maintained by the control circuit 31.

The circuit 31 is utilized to decrease variations in pulse duration when the transistor current amplification factor varies. The unstable circuit condition or the negative resistance region is determined primarily by the magnitude of the current amplification factor of the transistor 10. A transistor with a low amplification factor will tend to become unstable during the conducting part of the cycle at very much higher electrode currents than will a transistor with a high current amplification factor. This can be illustrated by reference to Fig. 2 where the dashed line represents the characteristic of another transistor, not shown, having a larger current amplification factor. The current amplification factor of a transistor determines the slope of the negative resistance curve for a fixed base resistance. The curve FOEB represents the volt-ampere input characteristic of the transistor which has the larger current amplification factor. The time for the emitter potential to decrease from a potential characterized from point B on the volt-ampere characteristic to point H corresponds to a shorter time than that from point B to point E. As a matter of fact, the transition from H to E tends to take a much longer time than that taken to transverse B to H because the emitter current falls off exponentially. Due to the exponential variation of the emitter current in relation to time, a small change in emitter current near the knee of a characteristic requires a relatively long time. A small variation in current amplification factor shifts the characteristic, or at least the knee of the characteristic, a sufficient amount to result in substantial variations in the duration of the pulse provided by the trigger circuit. By using a base clamping voltage the knee of the curve effectively occurs at a much higher emitter voltage, corresponding to point C, which is chosen to correspond with the minimum current amplification factor expected. For both transistors, therefore, the minimum emitter potential is the base clamping voltage at point C instead of being that of point H for one transistor and of point E for the other.

By utilizing a voltage divider consisting of resistors 28 and 29, the source 30 may be the same as the source 21 so that variations in battery potential will not affect the duration of the output pulse. In a similar manner, the voltage divider consisting of resistor 36 and the resistor 37 shunted by capacitor 38 in the control circuit 33 maintains, as is hereinafter described, the initial relative magnitude of the output pulse independent of battery variations.

Due to the effect of circuit 31, the current of the emitter electrode 11 of transistor 10 falls from point C in Fig. 2 through point D to point G and the transistor 10 ceases to conduct. At point G, the capacitor 17 starts to recharge through the resistor 18 and the varistor 20 and through the resistor 35. The bias network from resistor 18 to battery 21 is now conducting. As the emitter and base potentials become more positive the varistor 26 once again becomes reversed-biased. The capacitor 17 recharges until point A is reached with current also passing through the biasing path, described above, from ground through resistor 18, the parallel combination of varistor 20 and resistor 19, varistor 16, varistor 22 and battery 21.

The emitter voltage does not become more positive than that of point A even though the emitter load line intersects the characteristic at a potional greater than that at point A due to the effect of the control circuit 33. Wihout the control circuit 33 the initial magnitude of the output pulse depends on the voltage across capacitor 17 at the time the circuit is triggered. If enough time has elapsed after an input trigger pulse, capacitor 17 will be able to return to the same starting point. If, however, the time between pulses varies and is not sufficiently long to allow the capacitor 17 to recharge, the initial emitter potential would vary as well. The circuit 33 effectively clamps the electrode 11 at a minimum potential which is determined by the maximum repetition frequency. The maximum repetition frequency has the smallest interval between input pulses. If the maximum repetition frequency is further increased, resistors 36 and 37 can be adjusted or changed so that the equilibrium point would be at a potential lower than that corresponding to point A so that the recharge time for capacitor 17 to reach the equilibrium potential would be smaller. The equilibrium point can therefore be moved up or down the line from point E to the origin in accordance with the maximum repetition frequency.

In an exemplary embodiment of the present invention the following circuit parameters are utilized to provide an output pulse having a duration of 300 to 400 microseconds with a maximum pulse repetition frequency of 500 pulses per second and variations in current amplification factor from 1.7 to 3.2:

| | |
|---|---|
| Capacitor 15 | 0.01 microfarad. |
| Capacitor 17 | 0.5 microfarad. |
| Resistor 18 | 3160 ohms. |
| Resistor 19 | 3160 ohms. |
| Battery 21 | 19 volts±5 volts. |
| Resistor 22 | 0.5 megohm. |
| Resistor 23 | 3160 ohms. |
| Capacitor 24 | 0.10 microfarad. |
| Capacitor 27 | 0.75 microfarad. |
| Resistor 28 | 1000 ohms. |
| Resistor 29 | 3830 ohms. |
| Battery 30 | 19 volts±5 volts. |
| Battery 32 | 19 volts±5 volts. |
| Resistor 35 | 6810 ohms. |
| Resistor 36 | 3800 ohms. |
| Resistor 37 | 681 ohms. |
| Capacitor 38 | 0.75 microfarad. |

In an exemplary embodiment of the present invention, if the circuits 31 and 33 are not utilized the duration of the output pulses vary from 430 to 2000 microseconds.

Although the invention has been described as relating to specific embodiments, numerous other embodiments and modifications will readily appear to one skilled in the art without departing from the scope of the invention. For example, the invention is, as described above, not limited to the use of point contact transistors, and the equilibrium condition may be in the high current region instead of in the low current region. The other types of transistors that the principles of the present invention are applicable to are transistors such as the junction type or to two junction type transistors, one n-p-n and one p-n-p which may be interconnected to function as the point contact transistor, etc. It is evievident therefore that the principles of the present invention are applicable to numerous other modifications.

What is claimed is:

1. A monostable trigger circuit comprising a semiconductor device having a current amplification factor greater than one, said device including an input electrode, and a control electrode, a feedback resistor connected to said control electrode to provide together with said semiconductor device for an input characteristic including a low current positive region, a high current positive region and a valley point, a capacitive device connected to said input electrode, and circuit means connected to the junction of said feedback resistor and said control electrode to determine the minimum potential of said control electrode during the operation of said semiconductor device in said high current positive region, said minimum potential being less negative than the potential of said control electrode at said valley point.

2. A transistor trigger circuit for supplying pulses having a duration independent of changes in the current amplification factor of the transistor comprising a current amplifying transistor having an emitter electrode, a base electrode, and a collector electrode, a feedback promoting impedance connected to said base electrode providing with said transistor a negative resistance emitter characteristic having a negative resistance region, a low current positive resistance region, and a high current positive resistance region, said negative resistance region and said high current positive resistance region being continuous at a valley point, circuit means connected to said emitter electrode for providing an equilibrium condition in said low current positive resistance region, a terminal for receiving input pulses for triggering said transistor circuit from said low current positive resistance region to said high current positive resistance region, a source of voltage having a magnitude less than the magnitude of that voltage developed across said feedback promoting impedance at said valley point, an asymmetrically conducting impedance element connecting said voltage source to the junction of said base electrode and said feedback promoting impedance and so arranged as to be conductive when the voltage across said feedback promoting impedance in said high current positive resistance region is greater than the voltage of said source.

3. A pulse amplifier comprising a transistor having a base, emitter, and collector, a feedback promoting impedance connected to said base, a capacitive device connected to said emitter, said feedback promoting impedance and said capacitive device providing with said transistor for a low current stable and a high current unstable state of operation, an input terminal connected to said emitter for receiving triggering pulses each causing a transfer from said low current state to said high current state, circuit means connectable to the junction of said base and said feedback promoting impedance for controlling the duration of the operation of said transistor in said high current state, a varistor device connecting said circuit means with said junction, and means responsive to the voltage developed across said feedback promoting impedance to forward bias said varistor device only during the operation of said transistor in said high current state whereby a minimum base operating potential during said high current state is determined.

4. A pulse amplifier in accordance with claim 3 wherein said circuit means includes a negative source of potential connected by said varistor device to said base, said varistor device being poled in a direction of positive base current.

5. A pulse amplifier in accordance with claim 3 in combination with an emitter clamping circuit connected to said emitter for fixing the potential of said emitter during said low current stable state of operation.

6. A pulse amplifier in accordance with claim 5 wherein said emitter clamping circuit includes a negative source of potential and a varistor serially connecting said negative source with said emitter and poled in a direction of negative emitter current.

7. A monostable trigger circuit comprising in combination a transistor having a base, emitter and collector electrode, a base resistor connected to said base electrode, a capacitive device connected to said emitter electrode, said base resistor and said capacitive device providing said transistor with an operating characteristic including a low current positive region, a negative resistance region, and a high current positive region, a first circuit means connected to the junction of said base resistor and said base electrode for controlling the operation of said transistor in said high current positive region whereby the occurence of the trailing edge of the amplifier output pulse is determined, and a second circuit means connected to the junction of said emitter electrode and said capacitive device and effective for preventing the potential of said emitter electrode from becoming greater than a predetermined maximum value whereby the occurrence of the leading edge of the amplifier output pulse is determined.

8. A pulse amplifier circuit for supplying pulses of constant duration comprising a transistor having an emitter electrode, a collector electrode, and a base electrode, circuit means including a feedback promoting impedance connect to said base electrode for providing with said transistor for a low current stable state and a high current unstable state of operation, means for controlling the duration of operation of said transistor in said high current state, an asymmetrically conducting impedance element having a high impedance condition and a low impedance condition connected between said base electrode and said control means, means for maintaining said asymmetrically conducting element in said high impedance condition during said stable state of operation, and biasing means for causing said asymmetrical element to change from said high impedance condition to said low impedance condition at a predetermined time after said transistor has entered said high current unstable state of operation.

9. A monostable trigger circuit comprising in combination a transistor having an emitter electrode, a base electrode, and a collector electrode; circuit means for providing said transistor with a low current stable state and a high current unstable state of operation, said circuit means including a feedback promoting resistor connected to said base electrode; a source of predetermined potential; an asymmetrical conducting device connecting the junction of said base electrode and said feedback resistor with said source of potential and poled in the direction to transmit current of the same polarity as transmitted by said base electrode, said asymmetrical conducting device and said voltage source being arranged so as to prevent the potential of said base electrode from exceeding said predetermined potential while said transistor is in said high current unstable state; and means for maintaining said emitter electrode at a predetermined potential during said low current stable state.

10. A monostable trigger circuit comprising a transistor device having an amplification factor greater than one, said device including an input electrode and a control electrode, a feedback promoting resistor connected to said control electrode, a capacitive device connected to said input electrode, said feedback resistor and said capacitive device providing said transistor device with a low current stable and a high current unstable state of operation, and biasing means responsive to the voltage developed across said feedback resistor during said high current unstable state to reverse bias said input electrode with respect to said control electrode at a predetermined time after said transistor device has entered said high current unstable state of operation, whereby the occurrence of the trailing edge of an output pulse is determined.

11. In a monostable trigger circuit, a transistor device having a current amplification factor greater than one, said device including an input terminal and a control terminal, a feedback promoting resistor connected to said control terminal, a capacitive device connected to said input terminal, said feedback resistor and said capacitive device providing said transistor device with a low current stable and a high current unstable state of operation, and biasing means responsive to the voltage developed across said feedback resistor during said unstable state to reverse bias said input terminal with respect to said control terminal at a predetermined time after said transistor has entered said unstable state of operation whereby the trailing edge of an output pulse is determined, said biasing means including a voltage source and a varistor device connecting said voltage source to the junction of said feedback resistor and said control terminal, said voltage source having a magnitude sufficient to maintain said varistor device in a reversed biased state during said low current state of operation.

12. A monostable trigger circuit comprising a semiconductor device having a current amplification factor greater than one, said device including an input electrode, a control electrode and an output electrode, a feedback promoting impedance connected to said control electrode, a capacitive device connected to said input electrode, said feedback impedance and said capacitive device providing said current device with a low current stable and a high current unstable state of operation, circuit means connectable to said control electrode to control the operation of said semiconductor device in said high current unstable state of operation, means responsive to the operation of said semiconductor device in said high current unstable state to connect said circuit means to the junction of said feedback promoting impedance and said control electrode at a predetermined time after said semiconductor device has entered said high current unstable state of operation, and a load connected to said output electrode.

13. A monostable trigger circuit comprising a transistor device having a current amplification factor greater than one and an emitter, a collector and a base electrode, a feedback promoting impedance connected to said base electrode, load means connected to said collector electrode, biasing means including a first and a second unilateral conducting device in tandem and each poled in the direction of positive emitter current, said first and second unilateral conducting devices being arranged in a shunt relationship to the emitter-base circuit of said transistor device, an impedance element connecting said base electrode and the junction of said first and said second unilateral device, a capacitive device connected to the junction of said first and second unilateral devices, said feedback promoting impedance and said capacitive device providing said transistor device with a stable and unstable state of operation, a first circuit means for preventing said emitter electrode from becoming greater than a maximum predetermined first potential, a third unilateral device connecting said first circuit means to the junction of said first and second unilateral devices and poled in a direction of negative emitter current, a second circuit means connectable to said base electrode for preventing the potential of said base electrode from becoming greater than a maximum predetermined second potential, and a connecting means responsive to the potential developed across said feedback resistor to connect said second circuit means to said base electrode, said connecting means including a fourth unilateral conducting device poled in a direction of positive base current.

References Cited in the file of this patent

UNITED STATES PATENTS

| | | |
|---|---|---|
| 2,629,833 | Trent | Feb. 24, 1953 |
| 2,644,895 | Lo | July 7, 1953 |
| 2,670,445 | Felker | Feb. 23, 1954 |
| 2,724,061 | Emery | Nov. 15, 1955 |

FOREIGN PATENTS

| | | |
|---|---|---|
| 162,946 | Australia | Aug. 27, 1953 |
| 1,098,225 | France | Mar. 2, 1955 |